(12) United States Patent
Ryou et al.

(10) Patent No.: US 10,490,356 B2
(45) Date of Patent: Nov. 26, 2019

(54) CAPACITOR AND METHOD OF MANUFACTURING THE SAME

(71) Applicant: SAMSUNG ELECTRO-MECHANICS CO., LTD., Suwon-si, Gyeonggi-do (KR)

(72) Inventors: Jeong Hoon Ryou, Suwon-si (KR); Dong Sik Yoo, Suwon-si (KR); Seung Hun Han, Suwon-si (KR); No Il Park, Suwon-si (KR); Seung Mo Lim, Suwon-si (KR); Hyun Ho Shin, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/713,151

(22) Filed: Sep. 22, 2017

(65) Prior Publication Data
US 2018/0308638 A1 Oct. 25, 2018

(30) Foreign Application Priority Data
Apr. 25, 2017 (KR) .................. 10-2017-0053039

(51) Int. Cl.
*H01G 4/33* (2006.01)
*H01L 49/02* (2006.01)

(52) U.S. Cl.
CPC .............. *H01G 4/33* (2013.01); *H01L 28/75* (2013.01)

(58) Field of Classification Search
CPC ......... H01L 28/75; H01L 28/91; H01L 28/90; H01L 29/945; H01G 4/33
See application file for complete search history.

(56) References Cited

U.S. PATENT DOCUMENTS

| 6,980,413 B1* | 12/2005 | Kim ...................... H01G 4/012 |
| | | 29/25.42 |
| 2001/0046737 A1* | 11/2001 | Ahn ................... H01L 21/76897 |
| | | 438/253 |

(Continued)

FOREIGN PATENT DOCUMENTS

| KR | 10-2006-0008650 | 1/2006 |
| KR | 10-2008-0043139 A | 5/2008 |

(Continued)

OTHER PUBLICATIONS

Notice of Office Action issued in Korean Patent Application No. 10-2017-0053039, dated Feb. 23, 2018 (English abstract).

*Primary Examiner* — Wael M Fahmy
*Assistant Examiner* — Sarah K Salerno
(74) *Attorney, Agent, or Firm* — Morgan, Lewis & Bockius LLP

(57) ABSTRACT

A capacitor includes a body including a substrate and a capacitance layer disposed on the substrate. The substrate includes a plurality of first trenches penetrating from one surface of the substrate to an interior of the substrate, and a first capacitor layer disposed on the one surface of the substrate and in the first trenches. The first capacitor layer includes a first dielectric layer and first and second electrodes disposed on opposing sides thereof. The capacitance layer includes a plurality of second trenches penetrating from one surface of the capacitance layer to an interior of the capacitance layer, and a second capacitor layer disposed on the one surface of the capacitance layer and in the second trenches. The second capacitor layer includes a second dielectric layer and third and fourth electrodes disposed on opposing sides thereof. A method of manufacturing the capacitor is also provided.

22 Claims, 16 Drawing Sheets

(56) References Cited

U.S. PATENT DOCUMENTS

| | | | | |
|---|---|---|---|---|
| 2010/0054021 A1* | 3/2010 | Thies | ................ | H01L 27/10852 |
| | | | | 365/149 |
| 2010/0087042 A1* | 4/2010 | Kim | ................... | H01L 23/5223 |
| | | | | 438/396 |
| 2014/0092524 A1 | 4/2014 | Kim et al. | | |
| 2015/0079756 A1* | 3/2015 | Yamawaki | ........ | H01L 27/10852 |
| | | | | 438/381 |
| 2016/0020267 A1 | 1/2016 | Lin | | |

FOREIGN PATENT DOCUMENTS

| | | |
|---|---|---|
| KR | 10-2014-0042482 | 4/2014 |
| KR | 10-1422923 B1 | 7/2014 |

\* cited by examiner

CAPACITOR AND METHOD OF MANUFACTURING THE SAME

CROSS-REFERENCE TO RELATED APPLICATION(S)

This application claims benefit of priority to Korean Patent Application No. 10-2017-0053039 filed on Apr. 25, 2017 in the Korean Intellectual Property Office, the disclosure of which is incorporated herein by reference in its entirety.

BACKGROUND

1. Field

The present disclosure relates to a capacitor and a method of manufacturing the same.

2. Description of Related Art

Portable information technology (IT) products such as smartphones, wearable devices, and the like, are being thinned. To enable such thinning the devices, the passive elements in the devices are themselves being thinned in order to decrease a thickness of the entire package.

To this end, demand for a thin-film capacitor capable of implementing a thinner thickness as compared to a multilayer ceramic capacitor has increased.

The thin-film capacitor has an advantage in that a thin capacitor may be implemented using thin film technology.

Further, the thin-film capacitor has an advantage in that it has low equivalent series inductance (ESL), unlike a multilayer ceramic capacitor according to the related art, such that the application of the thin-film capacitor as a decoupling capacitor in an application processor has been considered.

In order to use a thin-film capacitor as a decoupling capacitor in an application processor (AP) as described above, a thin-film capacitor has been manufactured in a form of a land-side capacitor (LSC).

However, in a case of existing embedded-type capacitors, it is impossible to rework a capacitor if a defect is identified in the capacitor and, as a result, the total device may be designated as a loss when only the capacitor has failed thereby leading to a significant loss expense. Therefore, there is a need to implement is a thin-film capacitor in a form of a reworkable land-side capacitor (LSC).

Meanwhile, since the LSC type thin-film capacitor is disposed between solder balls, the thin-film capacitor should be designed to have a size as small as possible to significantly decrease a solder ball removal area.

At the same time, research into a technology for applying a trench type structure capable of increasing a surface area contributing to implementing capacitance to the thin-film capacitor has been conducted in order to increase capacitance of the thin-film capacitor.

However, the trench type structure as described above has a problem in that in a case of forming a trench to have a deeper depth in order to increase capacitance, a process and a material may be restricted.

Therefore, a novel structure capable of increasing a total surface area while considering a process difficulty and limitations of the material itself has been required.

SUMMARY

An aspect of the present disclosure may provide a capacitor having a structure capable of significantly increasing capacitance of the capacitor, and a method of manufacturing the same.

According to an aspect of the present disclosure, a capacitor may include a body including a substrate and a capacitance layer disposed on the substrate. The substrate may include a plurality of first trenches penetrating from one surface of the substrate to an interior of the substrate, and a first capacitor layer disposed on the one surface of the substrate and in the first trenches and including a first dielectric layer and first and second electrodes alternately disposed with the first dielectric layer interposed therebetween. The capacitance layer may include a plurality of second trenches penetrating from one surface of the capacitance layer to an interior of the capacitance layer, and a second capacitor layer disposed on the one surface of the capacitance layer and in the second trenches and including a second dielectric layer and third and fourth electrodes alternately disposed with the second dielectric layer interposed therebetween.

According to another aspect of the present disclosure, a method of manufacturing a capacitor may include forming a first trench penetrating from one surface of a substrate to an interior of the substrate by etching the substrate, and forming a first capacitor layer including a first dielectric layer and first and second electrodes alternately disposed with the first dielectric layer interposed therebetween on the one surface of the substrate and in the first trench. A capacitance layer is formed on the one surface of the substrate, and a second trench penetrating from one surface of the capacitance layer to an interior of the capacitance layer is formed by etching the capacitance layer. A second capacitor layer is formed including a second dielectric layer and third and fourth electrodes alternately disposed with the second dielectric layer interposed therebetween on one surface of the capacitance layer and the second trench.

According to a further aspect of the present disclosure, a capacitor may include first and second capacitor layers. The first capacitor layer includes a first dielectric layer and first and second electrodes disposed on opposing side of the first dielectric layer, where the first capacitor layer, the first dielectric layer, and the first and second electrodes each include a planar portion and a U-shaped portion extending on one side of the planar portion. The second capacitor layer is disposed on another side of the planar portion of the first capacitor layer, and the second capacitor layer includes a second dielectric layer and third and fourth electrodes disposed on opposing side of the second dielectric layer. The second capacitor layer, the second dielectric layer, and the third and fourth electrodes each include a planar portion and a U-shaped portion extending from the planar portion. At least one of a depth and a width of the U-shaped portion of the first capacitor layer is different from a depth and a width, respectively, of the U-shaped portion of the second capacitor layer.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will be described in detail with reference to the accompanying drawings.

The X, Y, and Z directions illustrated in the accompanying drawings may refer to length, width, and thickness directions, respectively, or be sequentially represented by first, second, and third directions, respectively.

Figure 1:
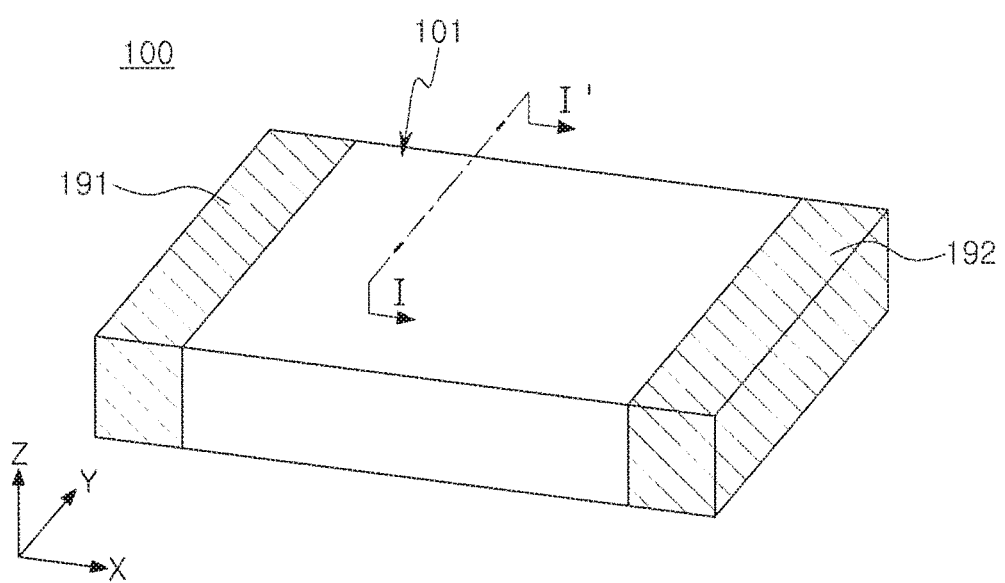
FIG. 1 is a perspective view schematically illustrating a capacitor according to an exemplary embodiment in the present disclosure.
Figure 2:
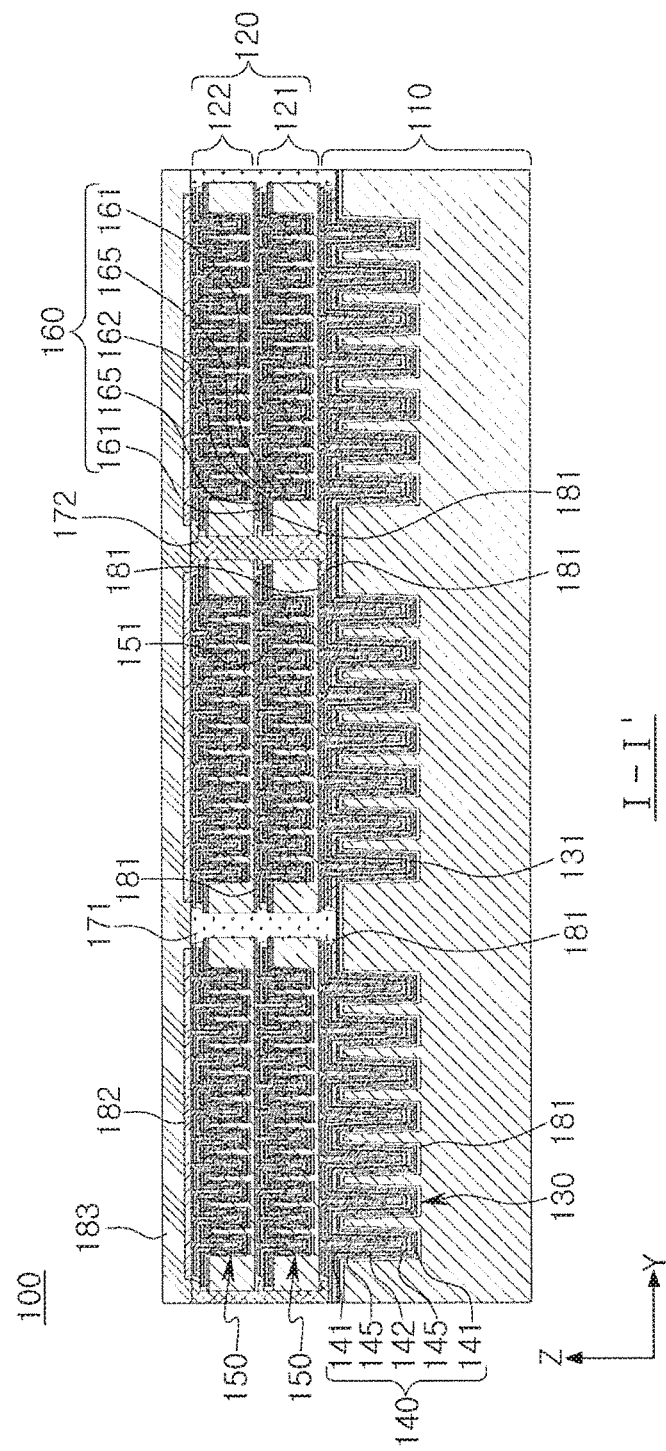
FIG. 2 is an enlarged view illustrating a portion of a cross section of the capacitor taken along line I-I' of FIG. 1.
Figure 3:
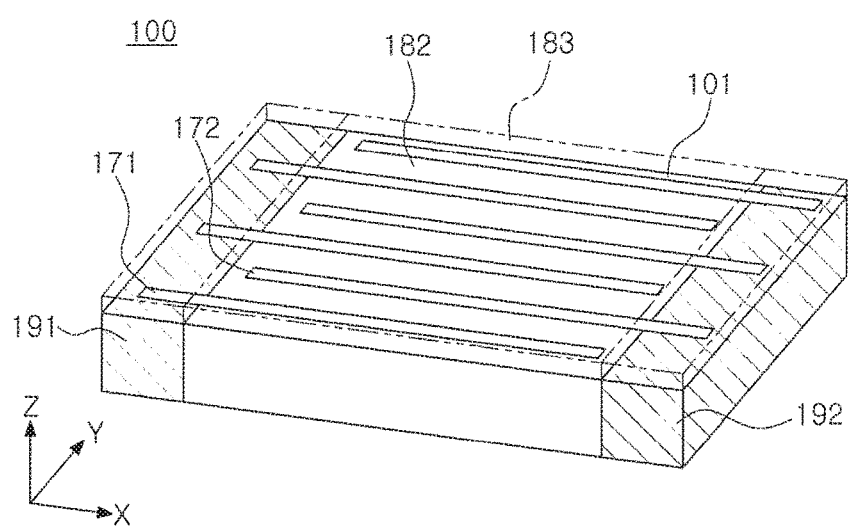
FIG. 3 is a view illustrating disposition of first and second connection electrodes as if seen through a transparent cover layer of the capacitor according to the exemplary embodiment in the present disclosure.

FIG. 1 is a perspective view schematically illustrating a capacitor 100 according to an exemplary embodiment in the present disclosure, FIG. 2 is an enlarged view illustrating a portion of a cross section of the capacitor taken along line I-I' of FIG. 1, and FIG. 3 is a view illustrating disposition of first and second connection electrodes as if seen through a transparent cover layer of the capacitor according to the exemplary embodiment in the present disclosure.

Hereinafter, the capacitor 100 according to the exemplary embodiment in the present disclosure will be described with reference to FIGS. 1 through 3.

The capacitor 100 according to the exemplary embodiment in the present disclosure may include a body 101 and first and second external electrodes 191 and 192 disposed on an outer portion of the body.

A shape of the body 101 is not particularly limited, but generally, may be a hexahedral shape. Further, the body 101 is not particularly limited in view of a dimension, but may have, for example, a size of 0.6 mm×0.3 mm (e.g., in the X-Y plane of FIG. 1) and may be a highly stacked and high-capacitance thin-film capacitor of 1.0 µF or more.

The body 101 may include a substrate 110 and capacitance layers 121 and 122 disposed on the substrate 110, which may serve as a support member supporting the capacitance layers 121 and 122. All of the capacitance layers 121 and 122 included in the body 101 may jointly configure a capacitance part 120.

The substrate 110 may be formed of any one selected from Si, $SiO_2$, $Al_2O_3$, MgO, $LaAlO_3$, and $SrTiO_3$, or a combination thereof. However, in a case in which the capacitance layers 121 and 122 are formed of polycrystalline silicon, the substrate 110 may be formed of silicon in order to increase adhesion between the substrate 110 and the capacitance layers 121 and 122. For example, as the substrate 110, a silicon wafer may be used.

A plurality of first trenches 130 penetrating from one surface of the substrate 110 (e.g., a top surface of the substrate 110) to an interior of the substrate 110 may be disposed in and extend into the substrate 110.

The first trench 130 may be formed by etching one surface of the substrate 110.

The first trench 130 may be formed to be elongated in the first (X) direction, or be regularly formed at a predetermined interval in the first (X) direction. However, in the present disclosure, a description will be provided on the basis on a case in which the first trench 130 is formed, to be elongated in the first (X) direction.

A first capacitor layer 140 including a first dielectric layer 145 and first and second electrodes 141 and 142 alternately disposed one or more times with the first dielectric layer 145 interposed therebetween is disposed on one surface of the substrate 110 and the first trench 130.

An insulating layer 181 may be disposed on a surface of the first trench 130, that is, a lower surface and a side wall surface of the first trench 130, and one surface of the substrate 110. For example, the insulating layer 181 may be disposed between the surface of the first trench 130 and the first capacitor layer 140. In one example, the first trench 130 may have a depth of about 26 µm, and a width of about 1.2 µm. The insulating layer 181 may be formed of the silicon oxide ($SiO_2$), but is not limited thereto.

The insulating layer 181 disposed on the surface of the first trench 130 and one surface of the substrate 110 may significantly decrease an electric leakage phenomenon capable of occurring between the first electrode 141 of the first capacitor layer 140 and the substrate 110.

The first capacitor layer 140 may include at least one first dielectric layer 145. For example, referring to FIG. 2, in a case in which the number of first dielectric layers 145 included in the first capacitor layer 140 is two, the first electrode 141, the first dielectric layer 145, the second electrode 142, the first dielectric layer 145, and the first electrode 141 may be sequentially stacked on one surface of the substrate 110 and the first trench 130. For instance, the first capacitor layer 140 may be disposed on the same one surface of the substrate 110 in which the first trench 130 is formed.

Each of the first and second electrodes 141 and 142 may be formed of a conductive material. A material of the first and second electrodes 141 and 142 may be determined depending on a material used in the first dielectric layer 145. In a case in which the first dielectric layer 145 is formed of a paraelectric material such as a metal oxide, or the like, the material of the first and second electrodes 141 and 142 may include a metal nitride. For example, the first and second electrodes 141 and 142 may be formed of TiN, but are not limited thereto.

The first and second electrodes 141 and 142 may be formed using an atomic layer deposition (ALD) method or an atomic vapor deposition (AVD) method, but are not limited thereto.

The first dielectric layer 145 may be formed of the paraelectric material such as the metal oxide, or the like. The first dielectric layer 145 may contain any one of the metal oxides such as $Al_2O_3$, $ZrO_2$, $HfO_2$, and the like, or a combination thereof. The first dielectric layer 145 may contain and be formed of the metal oxide such as $Al_2O_3$, $ZrO_2$, $HfO_2$, or the like, as a single material. Alternatively, the first dielectric layer 145 may also be formed of a composite layer in order to improve electric leakage properties. In a case in which the first dielectric layer 145 is formed of the composite layer, the first dielectric layer 145 may be a $ZrO_2$—$Al_2O_3$—$ZrO_2$ composite layer.

The first dielectric layer 145 may be formed using an atomic layer deposition (ALD) method or an atomic vapor deposition (AVD) method, but is not limited thereto.

The first and second electrodes 141 and 142 may be disposed to face each other with the first dielectric layer 145 interposed therebetween, such that the first capacitor layer 140 may operate as a capacitor when voltages having different polarities are applied to the first and second electrodes 141 and 142, respectively.

That is, the first and second electrodes 141 and 142 may be alternately disposed with the first dielectric layer 145 interposed therebetween, such that the first capacitor layer 140 having a metal-insulator-metal (MIM) structure may be formed.

When the first capacitor layer 140 is disposed on/in the first trench 130, a space may be formed on an upper portion of the center due to a structure of the first trench 130. The space as described above may cause formation of cracks in a capacitance part 120 to be described below. Therefore, a first filler portion 131 may be disposed in the space remaining after the first capacitor layer 140 is disposed on the first trench 130.

The first filler portion 131 may be formed of a conductor such as tungsten (W), or polycrystalline silicon. In a case in which the first filler portion 131 is formed of the conductor, resistance in an electrode adjacent to the first filler portion 131 may be significantly decreased. In a case in which the first filler portion 131 is formed of tungsten (W), there is no need to perform high-temperature heat treatment unlike polycrystalline silicon. For example, the first filler portion 131 may be formed by sputtering tungsten (W).

The insulating layer 181 may be disposed on the capacitor layer 140. The insulating layer 181 disposed on the first capacitor layer 140 may be formed of silicon oxide ($SiO_2$), but is not limited thereto. In a case in which the insulating layer 181 disposed on the first capacitor layer 140 is formed of silicon oxide ($SiO_2$), adhesion between the substrate 110 and the first capacitance layer 121 may be improved by forming the first capacitance layer 121 using polycrystalline silicon or amorphous silicon.

A surface area of the substrate 110 may be increased by forming the first trench 130 in the substrate 110, such that capacitance of the first capacitor layer 140 may be increased. Due to limitation in materials used in the substrate 110 and structural limitation of the first trench 130, there is a limitation in increasing the surface area of the substrate 110 using the first trench 130.

However, in the capacitor 100 according to the exemplary embodiment in the present disclosure, the above-mentioned limitation may be overcome and capacitance of the capacitor 100 may be increased by forming capacitance layers 121 and 122 in the thickness (Z) direction.

The capacitor 100 according to the exemplary embodiment in the present disclosure may further include the first capacitance layer 121 disposed on the substrate 110. The first capacitance layer 121 may be formed by growing polycrystalline silicon on the substrate 110 on which the first capacitor layer 140 is formed using a deposition method. A thickness of the first capacitance layer 121 may be 2 to 5 μm, but is not limited thereto. When the thickness of the first capacitance layer 121 is less than 2 μm, it may be difficult to form a second trench 150 to have a sufficient depth, such that an effect of increasing capacitance of the capacitor 100 may be insufficient, and when the thickness of the first capacitance layer 121 is more than 5 μm, a process difficulty at the time of forming the first capacitance layer 121 may be increased, cost and time are excessively consumed to form the first capacitance layer 121, and leakage properties may be deteriorated due to a defect occurring in the first capacitance layer 121.

In contrast, the first capacitance layer 121 may be formed by growing amorphous silicon on the substrate 110 on which the first capacitor layer 140 is formed using a deposition method. In a case in which the first capacitance layer 121 is formed of amorphous silicon, a deposition temperature is low and a deposition rate is fast as compared to polycrystalline silicon, such that the first capacitance layer 121 may be formed to be thicker than that in a case in which the first capacitance 121 is formed of polycrystalline silicon. In the case in which the first capacitance layer 121 is formed of amorphous silicon, the first capacitance layer 121 may grow at a thickness up to 10 μm.

Here, the insulating layer 181 may be disposed between the substrate 110 and the first capacitance layer 121.

A plurality of second trenches 150 penetrating from one surface of the first capacitance layer 121 to an interior of the first capacitance layer 121 may be disposed in (or formed in) the first capacitance layer 121.

The second trench 150 may be formed by etching one surface of the first capacitance layer 121.

The second trench 150 may be formed to be elongated in the first (X) direction, or be regularly formed at a predetermined interval in the first (X) direction. However, in the present disclosure, a description will be provided on the basis of a case in which the second trench 150 is formed to be elongated in the first (X) direction.

The second trench 150 may have a narrow width or a shallow depth as compared to the first trench 130. Here, the number of second trenches 150 disposed per unit area may be larger than that of first trenches 130 in order to sufficiently increase capacitance of a second capacitor layer 160 disposed on the first capacitance layer 121.

A second capacitor layer 160 including a second dielectric layer 165 and third and fourth electrodes 161 and 162 alternately disposed with the second dielectric layer 165 interposed therebetween is disposed on one surface of the first capacitance layer 121 and the second trench 150.

An insulating layer 181 may be disposed on a surface of the second trench 150, that is, a lower surface and a side wall surface of the second trench 150. For example, the insulating layer 181 may be disposed between the surface of the second trench and the second capacitor layer 160. The insulating layer 181 may be formed of the silicon oxide ($SiO_2$) but is not limited thereto. A depth of the second trench 150 may be shallower than the thickness of the first capacitance layer 121. For example, the second trench 150 may have a depth of 3 to 7 μm. Further, the second trench 150 may have a width of 0.22 to 0.35 μm. Here, the second trench 150 may have an aspect ratio of about 20:1.

The insulating layer 181 disposed on the surface of the second trench 150 may significantly decrease an electric leakage phenomenon capable of occurring between the third electrode layer 161 of the second capacitor layer 160 and the first capacitance layer 121.

The second capacitor layer 160 may include at least one second dielectric layer 165. For example, referring to FIG. 2, in a case in which the number of second dielectric layers 165 included in the second capacitor layer 160 is two, the third electrode 161, the second dielectric layer 165, the fourth electrode 162, the second dielectric layer 165, and the third electrode 161 may be sequentially stacked on one surface of the first capacitance layer 121 and the second trench 150.

The third and fourth electrodes 161 and 162 may be formed of a conductive material. A material of the third and fourth electrodes 161 and 162 may be determined depending on a material used in the second dielectric layer 165. In a case in which the second dielectric layer 165 is formed of a paraelectric material such as a metal oxide, or the like, the material of the third and fourth electrodes 161 and 162 may include a metal nitride. For example, the third and fourth electrodes 161 and 162 may be formed of TiN, but are not limited thereto.

The third and fourth electrodes 161 and 162 may be formed using an atomic layer deposition (ALD) method or an atomic vapor deposition (AVD) method, but are not limited thereto.

The second dielectric layer 165 may be formed of the paraelectric material such as metal oxide, or the like. The second dielectric layer 165 may contain any one of the metal oxides such as $Al_2O_3$, $ZrO_2$, $HfO_2$, and the like, or a combination thereof. The second dielectric layer 165 may contain and be formed of the metal oxide such as $Al_2O_3$, $ZrO_2$, $HfO_2$, or the like, as a single material. Alternatively, the second dielectric layer 165 may also be formed of a composite layer in order to improve electric leakage properties. In a case in which the second dielectric layer 165 is formed of the composite layer, the second dielectric layer 165 may be a $ZrO_2$—$Al_2O_3$—$ZrO_2$ composite layer.

The second dielectric layer 165 may be formed using an atomic layer deposition (ALD) method or an atomic vapor deposition (AVD) method, but is not limited thereto.

The third and fourth electrodes 161 and 162 may be disposed to face each other with the second dielectric layer 165 interposed therebetween, such that the second capacitor layer 160 may operate as a capacitor when voltages having different polarities are applied to the third and fourth electrodes 161 and 162, respectively.

That is, the third and fourth electrodes 161 and 162 may be alternately disposed with the second dielectric layer 165 interposed therebetween, such that the second capacitor layer 160 having a metal-insulator-metal (MIM) structure may be formed.

When the second capacitor layer 160 is disposed on the second trench 150, a space may be formed on an upper portion of the center of the second trench 150 due to a structure of the second trench 150. The space as described above may cause occurrence of cracks in the capacitance part 120. Therefore, a second filler portion 151 may be disposed in the space remaining after the second capacitor layer 160 is disposed on the second trench 150.

The second filler portion 151 may be formed of a conductor such as tungsten (W), or polycrystalline silicon. In a case in which the second filler portion 151 is formed of the conductor, resistance in an electrode adjacent to the second filler portion 151 may be significantly decreased. In a case in which the second filler portion 151 is formed of tungsten (W), there is no need to perform high-temperature heat treatment unlike polycrystalline silicon. For example, the second filler portion 151 may be formed by sputtering tungsten (W).

The insulating layer 181 may be disposed on the second capacitor layer 160. The insulating layer 181 disposed on the second capacitor layer 160 may be formed of the silicon oxide ($SiO_2$), but is not limited thereto. In a case in which the insulating layer disposed on the second capacitor layer 160 is formed of the silicon oxide ($SiO_2$), adhesion between first and second capacitance layers 121 and 122 may be improved by forming a second capacitance layer 122 to be described below using polycrystalline silicon or amorphous silicon.

The second capacitance layer 122 may be further disposed on the first capacitance layer 121. A second trench 150 and a second capacitor layer 160 may be formed in the second capacitance layer 122 equally to the first capacitance layer 121. However, the second trenches 150 disposed in the first and second capacitance layers 121 and 122 may have different widths and depths from each other, but are not limited thereto.

The first and second capacitance layers 121 and 122 may configure a capacitance part 120. However, the capacitance part 120 is not limited thereto and may more generally include two or more capacitance layers. Here, an insulating layer (e.g., 181) may be disposed between each of the capacitance layers.

The first, second, third, and fourth electrodes 141, 142, 161, and 162 may each be electrically connected to a respective one of the first or second external electrode 191 or 192 through a first or second connection electrode 171 or 172.

The first connection electrode 171 may be disposed to penetrate from one surface of the capacitance layers 121 and 122 to the first electrode 141. Further, the second connection electrode 172 may be disposed to penetrate from one surface of the capacitance layers 121 and 122 to the second electrode 142.

The first connection electrode 171 may be connected to the first and third electrodes 141 and 161, and the second connection electrode 172 may be connected to the second and fourth electrodes 142 and 162. The insulating layer 181 may be disposed between the first connection electrode 171 and the second electrode 142 and between the first connection electrode 171 and the fourth electrode 162. The insulating layer 181 may be disposed between the second connection electrode 172 and the first electrode 141 and between the second connection electrode 172 and the third electrode 161.

Since the first connection electrode 171 is connected to the first and third electrodes 141 and 161, and the second connection electrode 172 is connected to the second and fourth electrodes 142 and 162, a wiring design for connecting the external electrodes and each of the electrodes may be performed at once regardless of the number of dielectric layers.

Referring to FIG. 3, the first and second external electrodes 191 and 192 may be disposed on both end surfaces of the body 101 in the first (X) direction. The first and second external electrodes 191 and 192 may be formed by dipping both end surfaces of the body 101 in the first (X) direction in a paste containing a conductive material. If necessary, the first and second external electrodes 191 and 192 may further include plating layers formed thereon.

Here, an upper portion of the first connection electrode 171 may be extended to be elongated in the first (X) direction of the body 101, such that one end portion of the first connection electrode 171 in the first (X) direction may be connected to the first external electrode 191. The other end portion of the first connection electrode 171 in the first (X) direction may be disposed to be spaced apart from the second external electrode 192, such that the first connection electrode 171 and the second external electrode 192 do not contact each other. A portion of the first connection electrode 171 penetrating through the capacitance part may be formed to be continuously elongated in the first (X) direction, or be formed in a form of vias disposed at a predetermined interval in the first (X) direction, but is not limited thereto.

An upper portion of the second connection electrode 172 may be extended to be elongated in the first (X) direction of the body 101, such that one end portion of the second connection electrode 172 in the first (X) direction may be connected to the second external electrode 192. The other end portion of the second connection electrode 172 in the first (X) direction may be disposed to be spaced apart from the first external electrode 191, such that the second connection electrode 172 and the first external electrode 191 do not contact each other. A portion of the second connection electrode 172 penetrating through the capacitance part may be formed to be continuously elongated in the first (X) direction, or be formed in a form of vias disposed at a predetermined interval in the first (X) direction, but is not limited thereto.

An insulating layer 182 may be disposed on a second capacitor layer 160 disposed in an uppermost portion of the body 101. Here, the insulating layer 182 disposed on the second capacitor layer 160 may be formed of the silicon oxide ($SiO_2$), but is not limited thereto. Uppermost portions of the first and second connection electrodes 171 and 172 may be insulated from each other by the insulating layer 182. In some embodiments, the insulating layer 182 may be disposed between the second capacitor layer 160 and the first and second connection electrodes 171 and 172.

A cover layer 183 may be disposed on the connection electrodes 171 and 172 and the insulating layer 182. The cover layer 183 may be formed of a polymer resin such as epoxy, but is not limited thereto. The cover layer 183 may serve to protect the capacitor 100 from external impact, conductive foreign materials, or the like.

Figure 4:
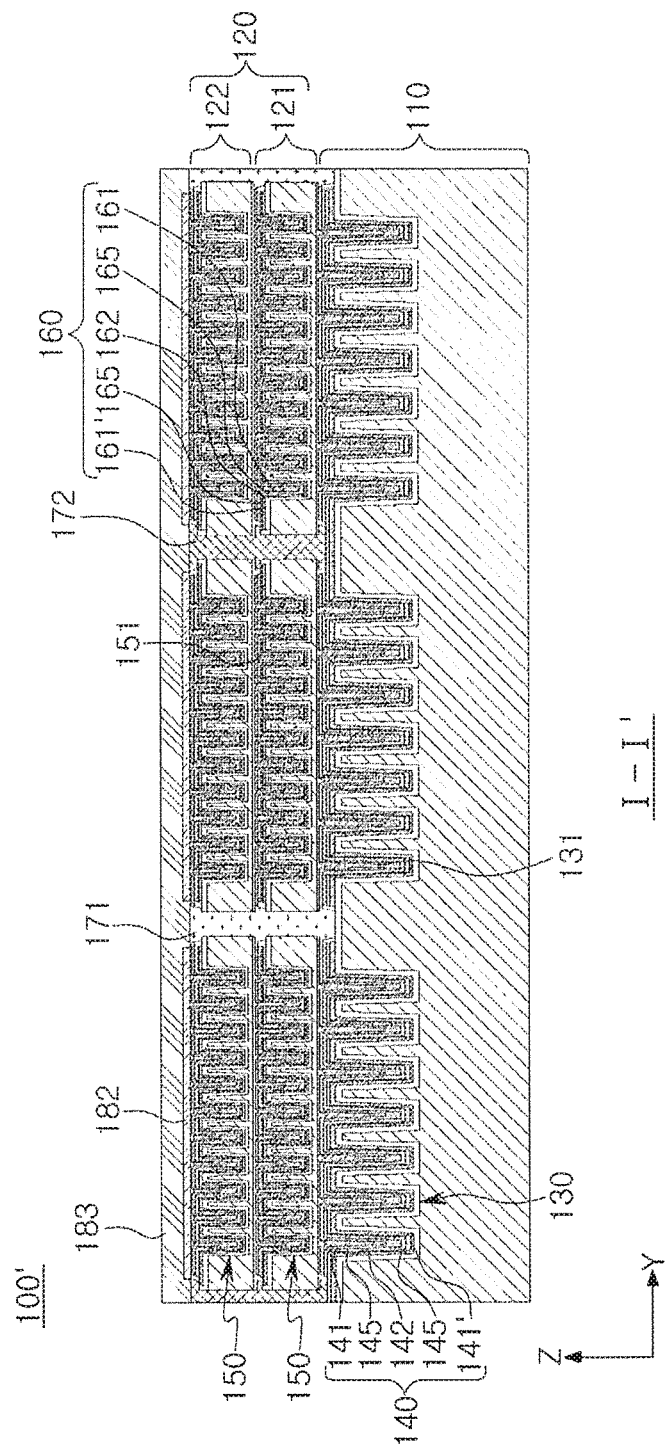
FIG. 4 is an enlarged view illustrating a portion of a cross section of a capacitor taken along line I-I' of FIG. 1, and illustrates an example in which n-type impurities are doped on one surface of a substrate, one surface of capacitance layers, and surfaces of first and second trenches.

FIG. 4, which is an enlarged view illustrating a portion of a cross section of a capacitor taken along line I-I' of FIG. 1, illustrates an example in which n-type impurities are doped on one surface of a substrate 110, one surfaces of first and second capacitance layers 121 and 122, and surfaces of first and second trenches 130 and 150.

Unlike the capacitor 100 illustrated in FIG. 2, a capacitor 100' illustrated in FIG. 4 may include first and third electrodes 141' and 161' formed by doping the n-type impurities on one surface of the substrate 110, one surfaces of the first and second capacitance layers 121 and 122, and the surfaces of the first and second trenches 130 and 150 instead of the insulating layer.

In this case, the first capacitor layer 140 may be formed by sequentially stacking the first electrode 141' formed by doping the n-type impurities, a first dielectric layer 145, a second electrode 142, the first dielectric layer 145, and a first electrode 141. Further, the second capacitor layer 160 may be formed by sequentially stacking the third electrode 161' formed by doping the n-type impurities, a second dielectric layer 165, a fourth electrode 162, the second dielectric layer 165, and a third electrode 161.

Figure 5:
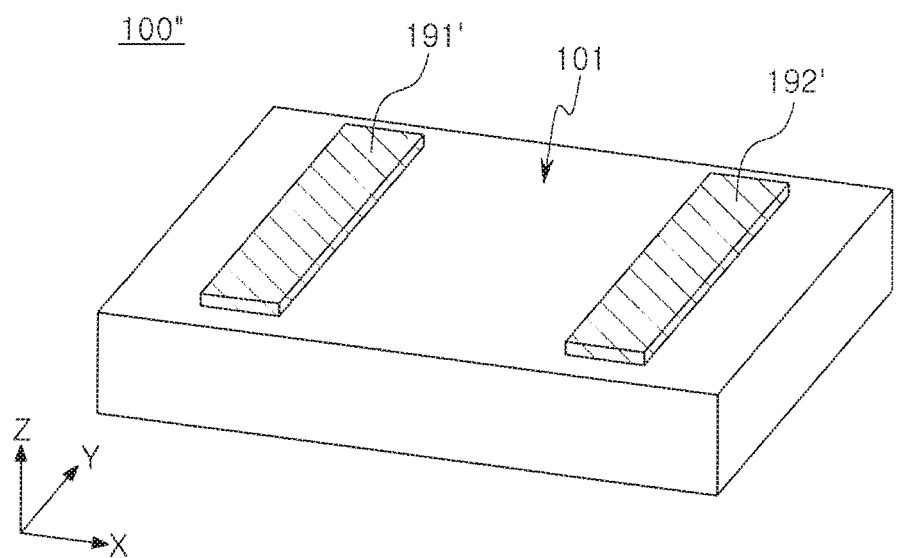
FIG. 5 illustrates an example in which first and second external electrodes of the capacitor according to the exemplary embodiment in the present disclosure are disposed in a form of lower electrodes.

FIG. 5 illustrates an example in which first and second external electrodes 191' and 192' of a capacitor 100" according to an exemplary embodiment in the present disclosure are disposed in a form of lower electrodes.

A cover layer 183 (see FIG. 2) may be disposed on a body 101. Here, referring to FIG. 5, the first and second external electrodes 191' and 192' may be disposed on an upper portion of the body 101, that is, an upper portion of the cover layer. For example, the first and second external electrodes 191' and 192' may be formed to be elongated in the second (Y) direction perpendicular to the first (X) direction. However, the first and second external electrodes 191' and 192' are not limited thereto, but may also or alternatively be formed to be elongated in the first (X) direction.

The first external electrode 191' may be connected to a first connection electrode 171 by at least one first conductive via penetrating through the cover layer (e.g., 183), and the second external electrode 192' may be connected to a second connection electrode 172 by at least one second conductive via penetrating through the cover layer (e.g., 183).

Figure 6:
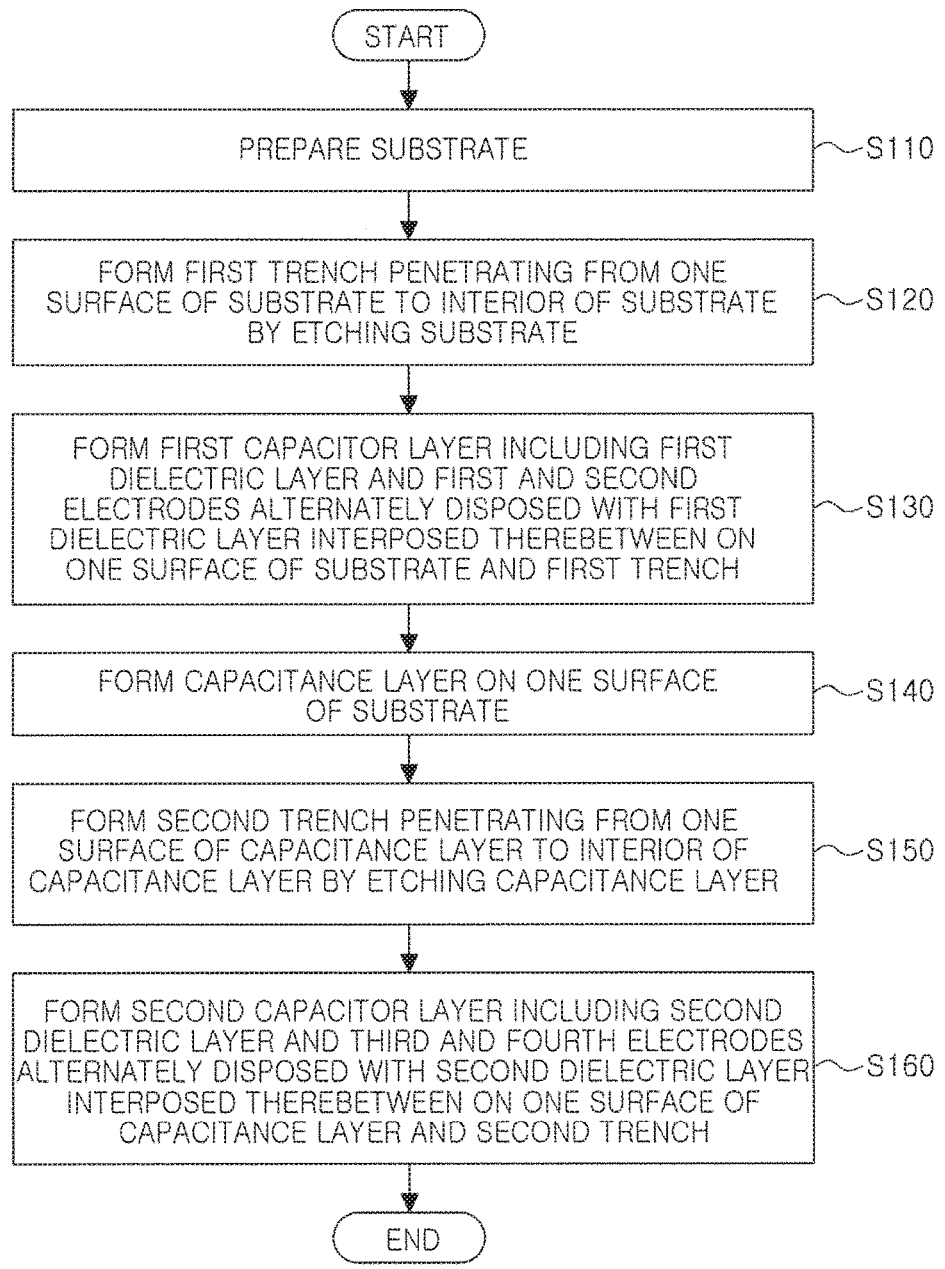
FIG. 6 is a flow chart schematically illustrating a method of manufacturing a capacitor according to another exemplary embodiment in the present disclosure.

FIG. 6 is a flow chart schematically illustrating a method of manufacturing a capacitor according to another exemplary embodiment in the present disclosure, and FIGS. 7 through 25 schematically illustrate each process of the method of manufacturing a capacitor according to another exemplary embodiment in the present disclosure.

The method of manufacturing a capacitor according to another exemplary embodiment in the present disclosure may include sequential steps for: preparing a substrate (S110); forming a first trench penetrating from one surface of the substrate to an interior of the substrate by etching the substrate (S120); forming a first capacitor layer including a first dielectric layer and first and second electrodes alternately disposed with the first dielectric layer interposed therebetween on one surface of the substrate and the first trench (S130); forming a capacitance layer on one surface of the substrate (S140); forming a second trench penetrating from one surface of the capacitance layer to an interior of the capacitance layer by etching the capacitance layer (S150); and forming a second capacitor layer including a second dielectric layer and third and fourth electrodes alternately disposed with the second dielectric layer interposed therebetween on one surface of the capacitance layer and the second trench (S160).

Hereinafter, each of the processes will be described with reference to FIGS. 7 through 25.

Figure 7:
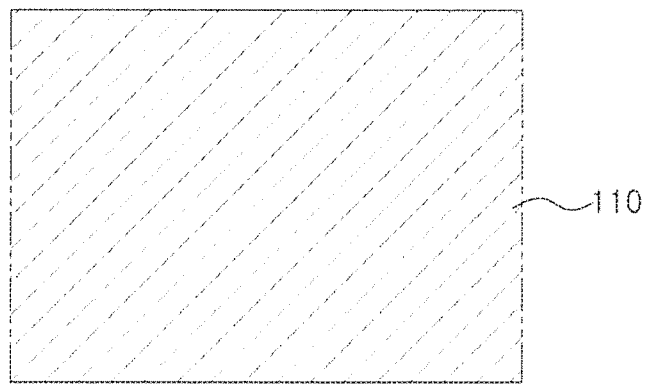
FIGS. 7 through 25 schematically illustrate each process step of the method of manufacturing a capacitor according to another exemplary embodiment in the present disclosure.

Referring to FIG. 7, first, the substrate may be prepared (S110).

A substrate 110 may be formed of any one selected from Si, $SiO_2$, $Al_2O_3$, MgO, $LaAlO_3$, and $SrTiO_3$, or a combination thereof. For example, as the substrate 110, a silicon wafer may be used.

A shape of the substrate 110 is not particularly limited, but generally, may be a hexahedral shape.

Figure 8:
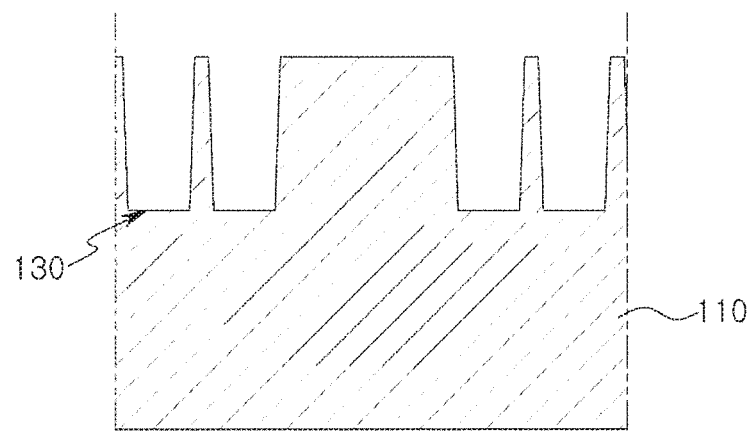

Next, as illustrated in FIG. 8, the first trench 130 penetrating from one surface of the substrate 110 to the interior of the substrate 110 may be formed by etching the substrate 110 (S120).

In order to form the first trench 130, a photoresist may be formed on the substrate 110. Then, the photoresist may be exposed and developed using a mask having a shape corresponding to the first trench 130 to thereby be patterned. Thereafter, the first trench 130 may be formed in a patterned shape by an etching method such as a reactive ion etching (RIE) method. The first trench 130 may be formed to be elongated in the first (length/X) direction of the substrate 110. Alternatively, a plurality of first trenches 130 may also be formed to be spaced apart from each other in the first direction by a predetermined distance. Further, a plurality of first trenches 130 may be formed to be parallel to each other and to be spaced apart from each other in the second (width/Y) direction perpendicular to the first direction of the substrate 110. Here, the first trenches 130 formed to be adjacent to each other in the second direction may form a single group or plural groups. When plural groups of the first trenches 130 are formed, the first trenches 130 may be formed so that the groups are spaced apart from each other by a suitable distance.

Figure 9:
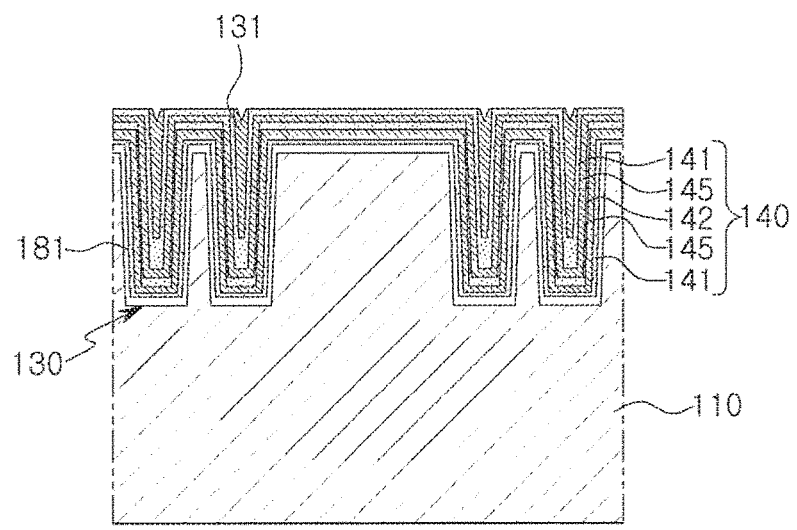

Next, as illustrated in FIG. 9, the first capacitor layer 140 including the first dielectric layer 145 and the first and second electrodes 141 and 142 disposed to face each other with the first dielectric layer 145 interposed therebetween may be formed on one surface of the substrate 110 and the first trench 130 (S130).

In more detail, first, in order to prevent an electric leakage phenomenon between the first capacitor layer 140 and the substrate 110, an insulating layer 181 may be formed on one surface of the substrate 110 and a surface of the first trench 130. The insulating layer 181 may be formed of silicon oxide ($SiO_2$), but not limited thereto. The insulating layer 181 may be formed by oxidizing one surface of the substrate 110 and the surface of the first trench 130 under an oxygen atmosphere.

However, although not illustrated, a n-type impurity layer may also be formed by injecting n-type impurities into one surface of the substrate 110 and the surface of the first trench 130 instead of forming the insulating layer 181, such that the n-type impurity layer may perform a role of the first electrode 141.

The first electrode 141 may be formed on one surface of the substrate 110 and the surface of the first trench 130 using an atomic layer deposition (ALD) method or an atomic vapor deposition (AVD) method.

The first electrode 141 may be formed using a conductive material. A material of the first electrode 141 may be determined depending on a material of the first dielectric layer 145. In a case in which the first dielectric layer 145 is formed of a paraelectric material such as a metal oxide, or the like, the material of the first electrode 141 may include a metal nitride. For example, the first electrode 141 may be formed of TiN, but is not limited thereto.

The first dielectric layer 145 may be formed on the first electrode 141. The first dielectric layer 145 may be formed of the paraelectric material such as the metal oxide, or the like. The first dielectric layer 145 may contain any one of the metal oxides such as $Al_2O_3$, $ZrO_2$, $HfO_2$, and the like, or a combination thereof. The first dielectric layer 145 may contain and be formed of the metal oxide such as $Al_2O_3$, $ZrO_2$, $HfO_2$, or the like, as a single material. Alternatively, the first dielectric layer 145 may also be formed of a composite layer in order to improve electric leakage properties. In a case in which the first dielectric layer 145 is formed of the composite layer, the first dielectric layer 145 may be a $ZrO_2$—$Al_2O_3$—$ZrO_2$ composite layer.

The first dielectric layer 145 may be formed using anatomic layer deposition (ALD) method or an atomic vapor deposition (AVD) method, but is not limited thereto.

The second electrode 142 maybe formed on the first dielectric layer 145. The second electrode 142 may be formed using the same material and the same method as those of the first electrode 141, but is not limited thereto.

As illustrated in FIG. 9, the first capacitor layer 140 may be formed by repeating the forming of the first dielectric layer 145 and the first electrode 141 as described above so that the first and second electrodes 141 and 142 are alternately disposed. Additionally, further layers can be included in the first capacitor layer 140 by repeating the forming of the first dielectric layer 145, the second electrode 142, the first dielectric layer 145, and the first electrode 141.

When the first capacitor layer 140 is disposed on the first trench 130, a space (e.g., a depression or gap) may be formed on an upper portion of the center of the first trench 130 due to a structure of the first trench 130 and of the first capacitor layer 140 disposed therein. The space as described above may cause cracks in a capacitance part 120 to be formed on the first capacitor layer 140 as described below. Therefore, a first filler portion 131 may be disposed in the space remaining after the first capacitor layer 140 is disposed on the first trench 130.

The first filler portion 131 may be formed of a conductor such as tungsten (W), or polycrystalline silicon. In a case in which the first filler portion 131 is formed of the conductor, resistance in an electrode adjacent to the first filler portion 131 may be significantly decreased. In a case in which the first filler portion 131 is formed of tungsten (W), there is no need to perform high-temperature heat treatment unlike polycrystalline silicon. For example, the first filler portion 131 may be formed by sputtering tungsten (W).

Figure 10:
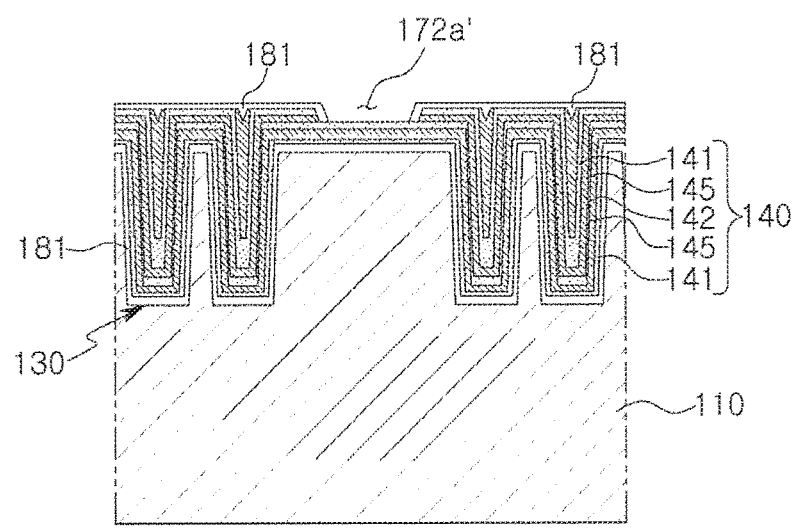

When the first capacitor layer 140 is formed, the insulating layer 181 may be disposed on one surface of the substrate 110, that is, on one surface of the first capacitor layer 140 as shown in FIG. 10.

Next, there is a need to form connection electrodes connecting the first and second electrodes 141 and 142 to external electrodes.

Hereinafter, a method of forming the connection electrode will be described based on a second connection electrode in the accompanying drawings. However, the description of the method of forming the second connection electrode may also be applied to a method of forming a first connection electrode within reasonable limits.

Referring to FIG. 10, a first connection electrode formation portion 172a' may be formed by removing a portion of the insulating layer 181 positioned between different groups of the first trenches 130, and removing a portion from one surface of the first capacitor layer 140 to the second electrode 142. Here, the insulating layer 181 may be formed between the second connection electrode and the first electrode 141 so that the second connection electrode and the first electrode 141 are not electrically connected to each other. At the time of forming the first connection electrode, the insulating layer 181 may be formed between the first connection electrode and the second electrode 142 so that the first connection electrode and the second electrode 142 are not electrically connected to each other.

Figure 11:
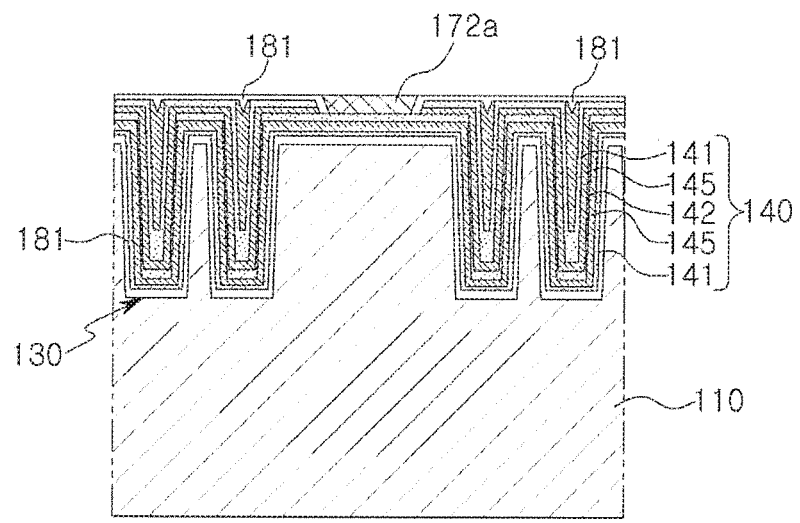

Next, referring to FIG. 11, a first connection electrode pad 172a may be formed in the first connection electrode formation portion 172a' using a conductive material. The first connection electrode pad 172a may be formed using a plating method, a conductive paste method, a physical vapor deposition (PVD) method, a chemical vapor deposition (CVD) method, or a sputtering method, but is not limited thereto.

Figure 12:
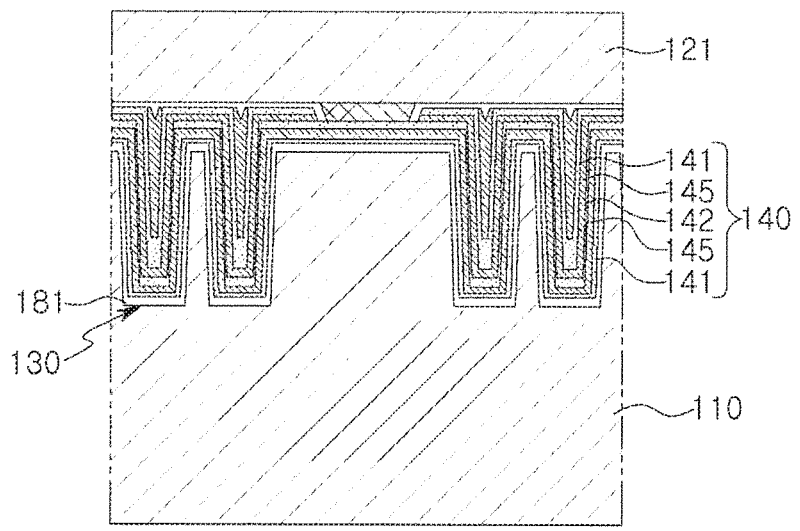

Then, referring to FIG. 12, the first capacitance layer 121 may be formed on one surface of the substrate 110 (S140). The first capacitance layer 121 may be formed by growing polycrystalline silicon on the substrate 110 on which the first capacitor layer 140 is formed using a deposition method. A thickness of the first capacitance layer 121 may be 2 to 5 µm, but is not limited thereto. When the thickness of the first capacitance layer 121 is less than 2 µm, it may be difficult to form a second trench 150 to have a sufficient depth, such that an effect of increasing capacitance of the capacitor 100 may be insufficient, and when the thickness of the first capacitance layer 121 is more than 5 µm, a process difficulty at the time of forming the first capacitance layer 121 may be increased, cost and time are excessively consumed to form the first capacitance layer 121, and leakage properties may be deteriorated due to a defect occurring in the first capacitance layer 121.

Alternatively, the first capacitance layer 121 may be formed by growing silicon on the substrate 110 on which the first capacitor layer 140 formed using a deposition method. In a case in which the first capacitance layer 121 is formed of amorphous silicon, a deposition temperature is low and a deposition rate is fast as compared to polycrystalline silicon, such that the first capacitance layer 121 may be formed to be thicker than that in a case in which the first capacitance 121 is formed of polycrystalline silicon. In the case in which the first capacitance layer 121 is formed of amorphous silicon, the first capacitance layer 121 may grow at a thickness up to 10 μm.

Here, the insulating layer 181 may be disposed between the substrate 110 and the first capacitance layer 121.

Figure 13:
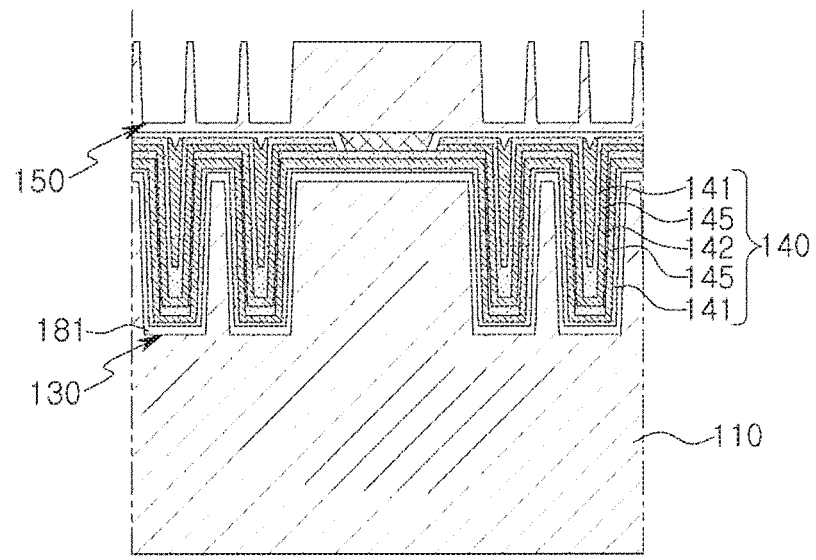

After the first capacitance layer 121 is formed, as illustrated in FIG. 13, the second trench 150 penetrating from one surface of the first capacitance layer to an interior of the first capacitance layer 121 may be formed by etching the first capacitance layer 121 (S150).

In order to form the second trench 150, a photoresist may be formed on the first capacitance layer 121. Then, the photoresist may be exposed and developed using a mask having a shape corresponding to the second trench 150 to thereby be patterned. Thereafter, the second trench 150 may be formed in a patterned shape by an etching method such as a reactive ion etching (RIE) method. The second trench 150 may be formed to be elongated in a first (length/X) direction of the first capacitance layer 121. Alternatively, a plurality of second trenches 150 may also be formed to be spaced apart from each other in the first direction by a predetermined distance. Further, a plurality of second trenches 150 may be formed to be parallel to each other and to be spaced apart from each other in a second (width/Y) direction perpendicular to the first direction of the first capacitance layer 121. Here, the second trenches 150 formed to be adjacent to each other in the second direction may form a single group or plural groups. When plural groups of the second trenches 150 are formed, the second trenches 150 may be formed so that the groups are spaced apart from each other by a suitable distance.

The second trench 150 may have a narrower width or a shallower depth as compared to the first trench 130. Here, the number of second trenches 150 disposed per unit area of the first capacitance layer 121 may be larger than that of first trenches 130 in the first capacitor layer 140 in order to sufficiently increase capacitance of a second capacitor layer 160 disposed on the first capacitance layer 121.

Figure 14:
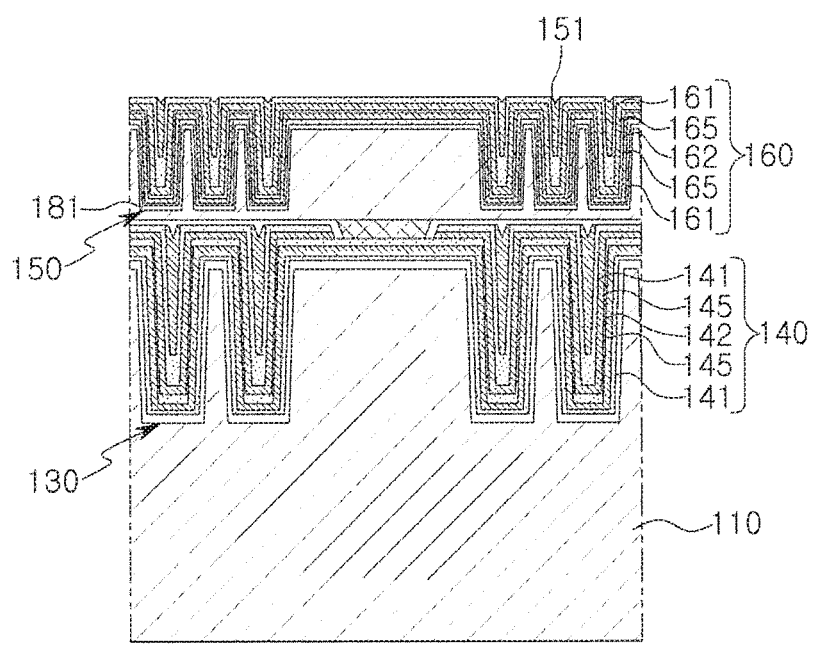

Next, as illustrated in FIG. 14, the second capacitor layer 160 including the second dielectric layer 165 and the third and fourth electrodes 161 and 162 alternately disposed with the second dielectric layer 165 interposed therebetween may be disposed on one surface of the first capacitance layer 121 and the second trench 150 (S160).

In more detail, first, in order to prevent an electric leakage phenomenon between the second capacitor layer 160 and the first capacitance layer 121, an insulating layer 181 may be formed on one surface of the first capacitance layer 121 and a surface of the second trench 150. The insulating layer 181 may be formed of the silicon oxide ($SiO_2$), but is not limited thereto. The insulating layer 181 may be formed by oxidizing one surface of the first capacitance layer 121 and the surface of the second trench 150 under an oxygen atmosphere.

However, although not illustrated, a n-type impurity layer may also be formed by injecting n-type impurities into one surface of the first capacitance layer 121 and the surface of the second trench 150 instead of forming the insulating layer 181, such that the n-type impurity layer may perform a role of the third electrode 161.

The third electrode 161 may be formed on one surface of the first capacitance layer 121 and the surface of the second trench 150 using an atomic layer deposition (ALD) method or atomic vapor deposition (AVD) method.

The third electrode 161 may be formed using a conductive material. A material of the third electrode 161 may be determined depending on a material of the second dielectric layer 165. In a case in which the second dielectric layer 165 is formed of a paraelectric material such as a metal oxide, or the like, the material of the third electrode 161 may include a metal nitride. For example, the third electrode 161 may be formed of TiN, but is not limited thereto.

The second dielectric layer 165 may be formed on the third electrode 161. The second dielectric layer 165 may be formed of the paraelectric material such as the metal oxide, or the like. The second dielectric layer 165 may contain any one of the metal oxides such as $Al_2O_3$, $ZrO_2$, $HfO_2$, and the like, or a combination thereof. The second dielectric layer 165 may contain and be formed of the metal oxide such as $Al_2O_3$, $ZrO_2$, $HfO_2$, or the like, as a single material. Alternatively, the second dielectric layer 165 may also be formed of a composite layer in order to improve electric leakage properties. In a case in which the second dielectric layer 165 is formed of the composite layer, the second dielectric layer 165 may be a $ZrO_2$—$Al_2O_3$—$ZrO_2$ composite layer.

The second dielectric layer 165 may be formed using an atomic layer deposition (ALD) method or an atomic vapor deposition (AVD) method, but is not limited thereto.

The fourth electrode 162 may be formed on the second dielectric layer 165. The fourth electrode 162 may be formed using the same material and the same method as those of the third electrode 161, but is not limited thereto.

As illustrated in FIG. 14, the second capacitor layer 160 may be formed by repeating the forming of the second dielectric layer 165 and the third electrode 161 as described above so that the third and fourth electrodes 161 and 162 are alternately disposed. Additionally, further layers can be included in the second capacitor layer 160 by repeating the forming of the second dielectric layer 165, the fourth electrode 162, the second dielectric layer 165, and the third electrode 161.

When the second capacitor layer 160 is disposed on the second trench 150, a space (e.g., a depression or gap) may be formed on an upper portion of the center of the second trench 150 due to a structure of the second trench 150 and of the second capacitor layer 160 disposed therein. The space as described above may cause cracks in a capacitance part 120 to be formed on the second capacitor layer 160 as described below. Therefore, a second filler portion 151 may be disposed in the space remaining after the second capacitor layer 160 is disposed on the second trench 150.

The second filler portion 151 may be formed of a conductor such as tungsten (W), or polycrystalline silicon. In a case in which the second filler portion 151 is formed of the conductor, resistance in an electrode adjacent to second filler portion 151 may be significantly decreased. In a case in which the second filler portion 151 is formed of tungsten (W), there is no need to perform high-temperature heat treatment unlike polycrystalline silicon. For example, the second filler portion 151 may be formed by sputtering tungsten (W).

Figure 15:
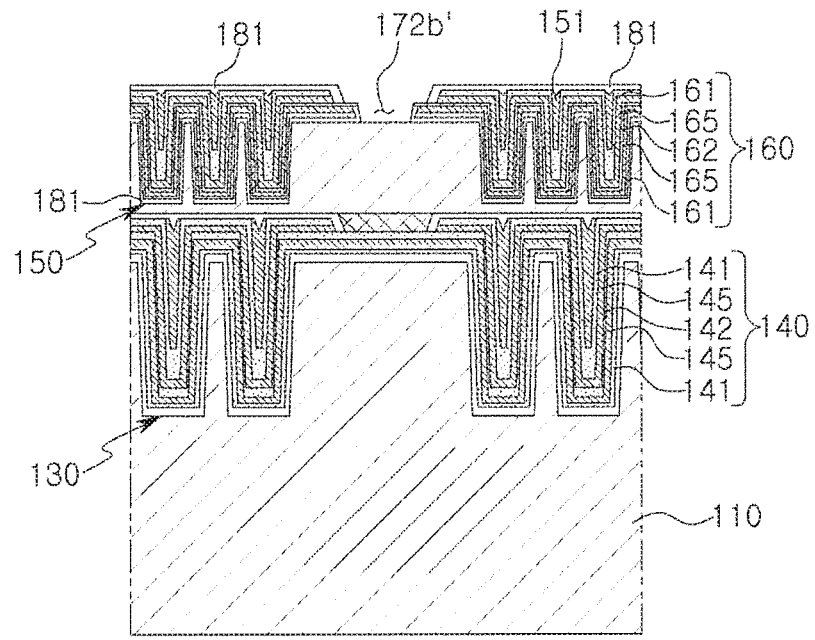

When the second capacitor layer 160 is formed, the insulating layer 181 may be disposed on one surface of the first capacitance layer 121, that is, on one surface of the second capacitor layer 160 as shown in FIG. 15.

Next, there is a need to form connection electrodes connecting the third and fourth electrodes 161 and 162 to the external electrodes.

Figure 16:
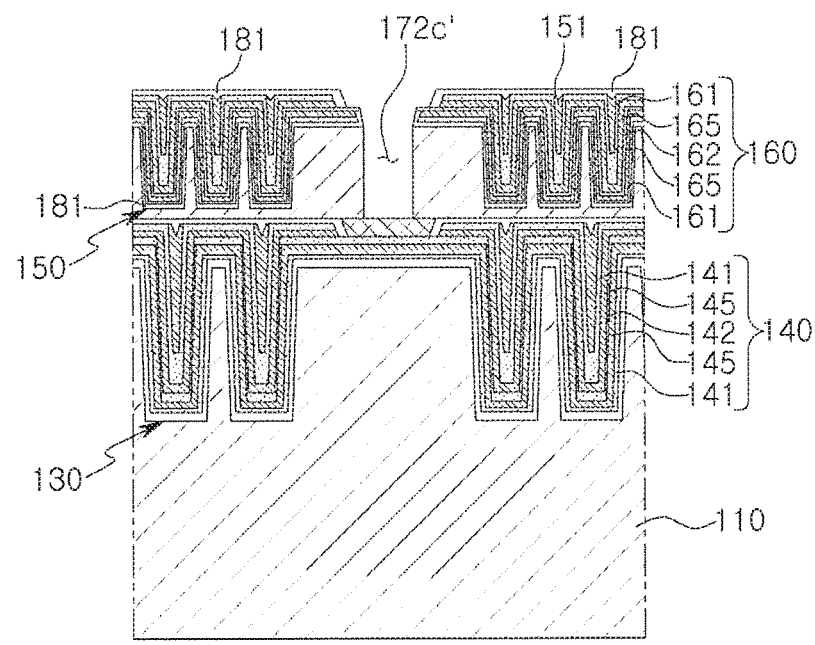

Referring to FIGS. 15 and 16, second and third connection electrode formation portions 172b' and 172c' may be formed by removing the second capacitor layer 160 and the first capacitance layer 121 on a position corresponding to a formation position of the above-mentioned connection electrode pad 172a. Here, the insulating layer 181 may be formed between the second connection electrode and the third electrode 161 so that the second connection electrode and the third electrode 161 are not electrically connected to each other. At the time of forming the first connection electrode, the insulating layer 181 may be formed between the first connection electrode and the fourth electrode 162 so that the first connection electrode and the fourth electrode 162 are not electrically connected to each other.

Figure 17:
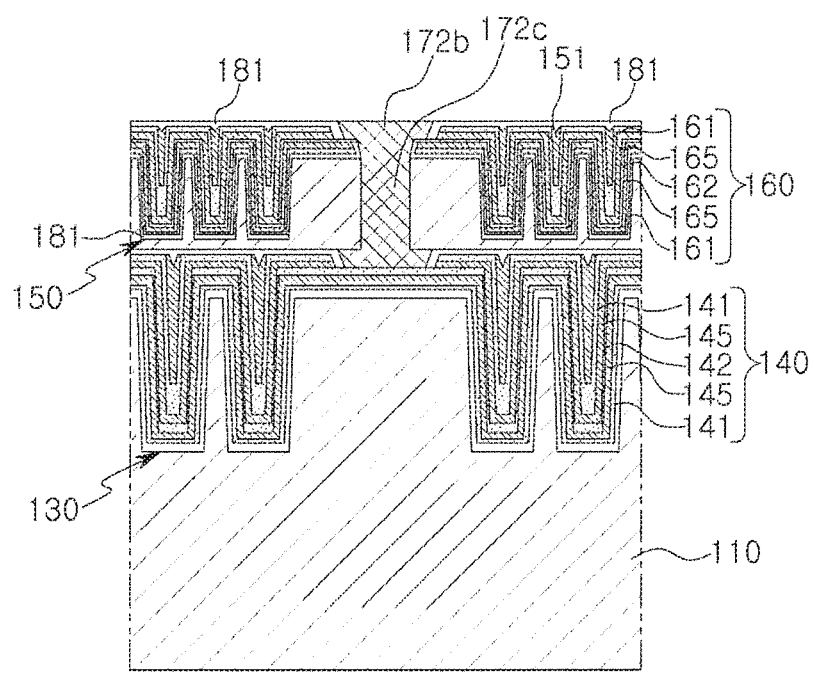
Figure 18:
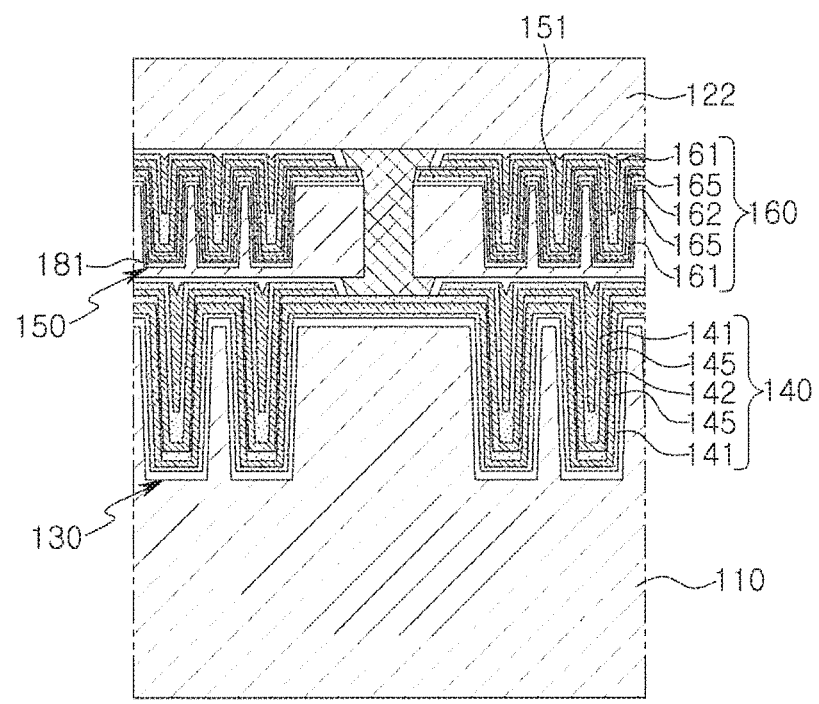
Figure 19:
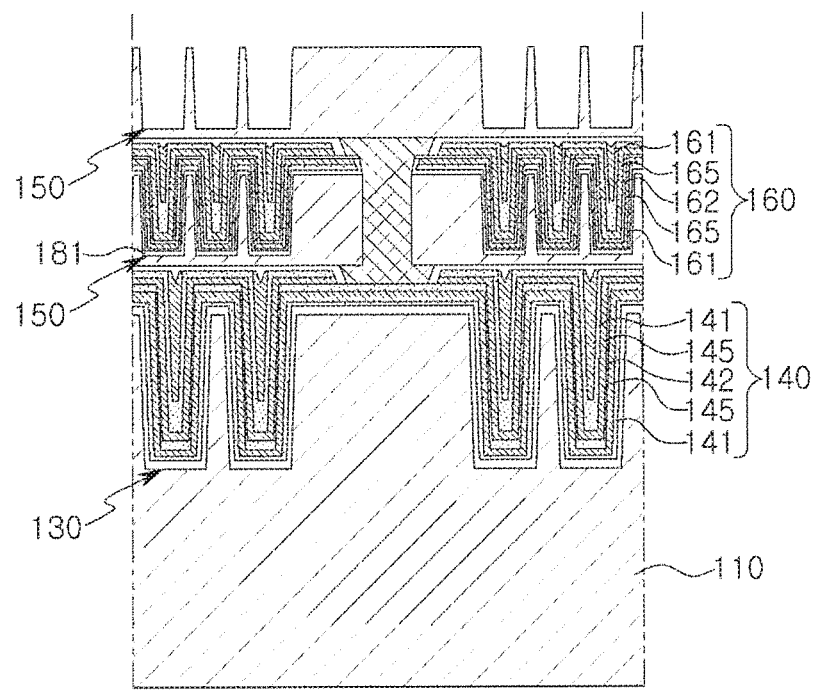
Figure 20:
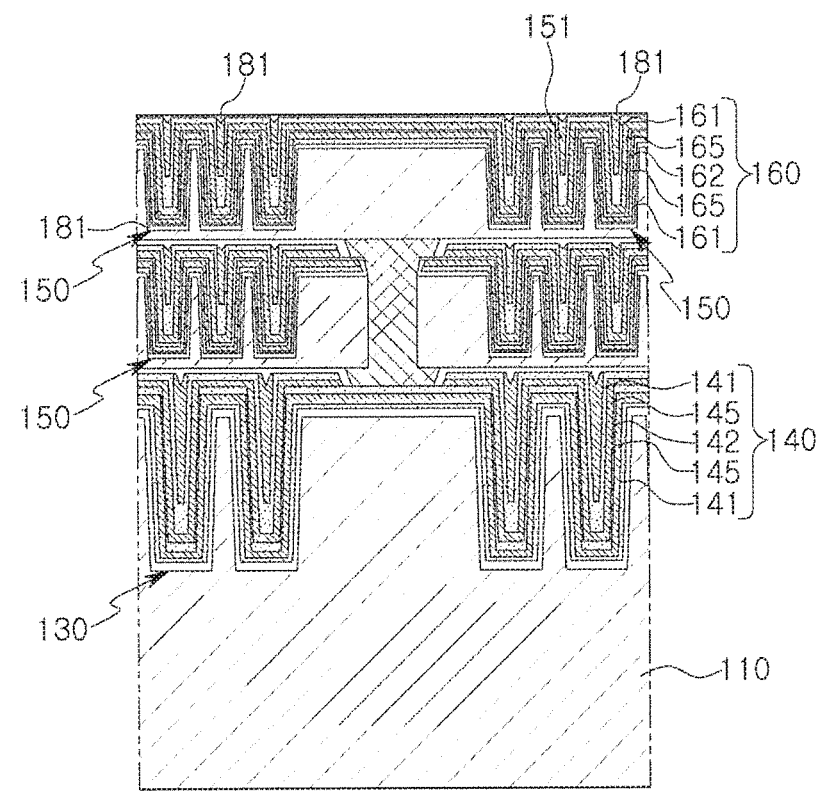
Figure 21:
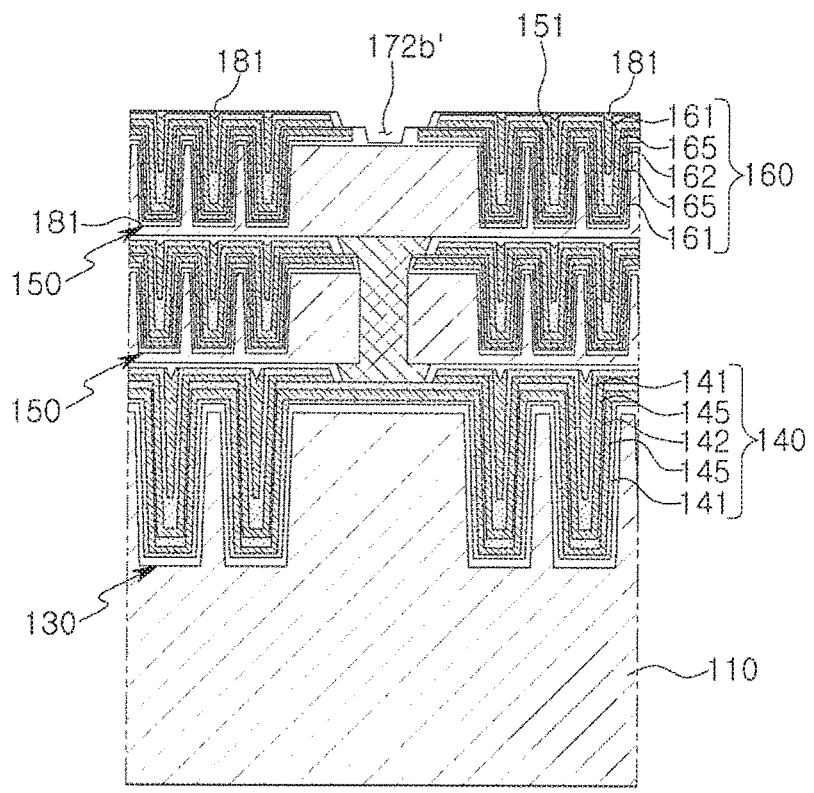
Figure 22:
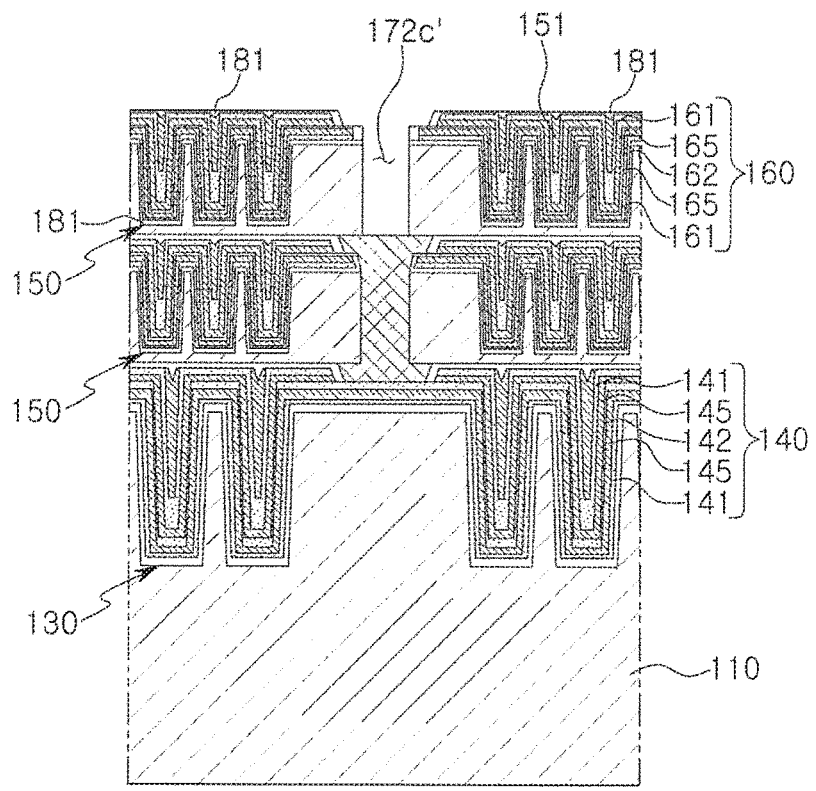
Figure 23:
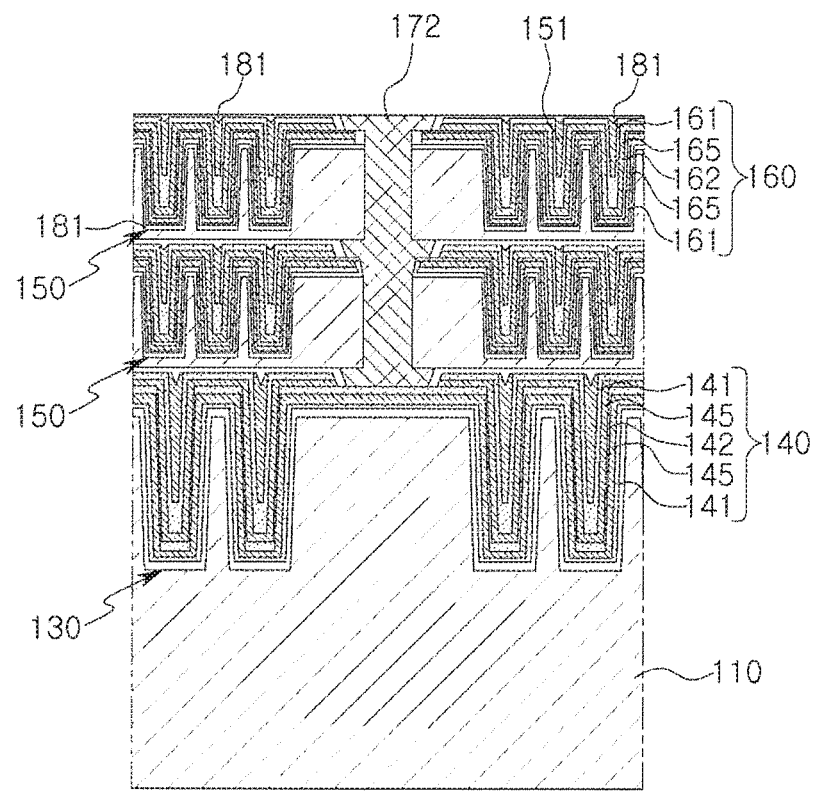

Next, referring to FIG. 17, a second connection electrode pad 172b and a connection electrode penetration portion 172c may be formed in the second and third connection electrode formation portions 172b' and 172c' using a conductive material. The second connection electrode pad 172b and the connection electrode penetration portion 172c may be formed using a plating method, a conductive paste method, a physical vapor deposition (PVD) method, a chemical vapor deposition (CVD) method, or a sputtering method, but are not limited thereto.

The first and second connection electrodes may be formed so that the first connection electrode penetrates from one surface of an uppermost second capacitor layer to the first electrode to thereby be connected to the first and third electrodes, and the second connection electrode penetrates from one surface of the uppermost second capacitor layer to the second electrode to thereby be connected to the second and fourth electrodes in a final product.

Then, referring to FIGS. 18 through 23, the forming of a second capacitance layer 122, a second trench 150 formed in the second capacitance layer 122, and a second capacitor layer 160 may be repeatedly performed by repeatedly performing S140 to S160. Here, the number of repetitions may be changed depending on the need for additional capacitance layers. For example, a capacitance part 120 including two capacitance layers 121 and 122 as illustrated in FIG. 2 may be formed by repeating S140 to S160 two times.

Figure 24:
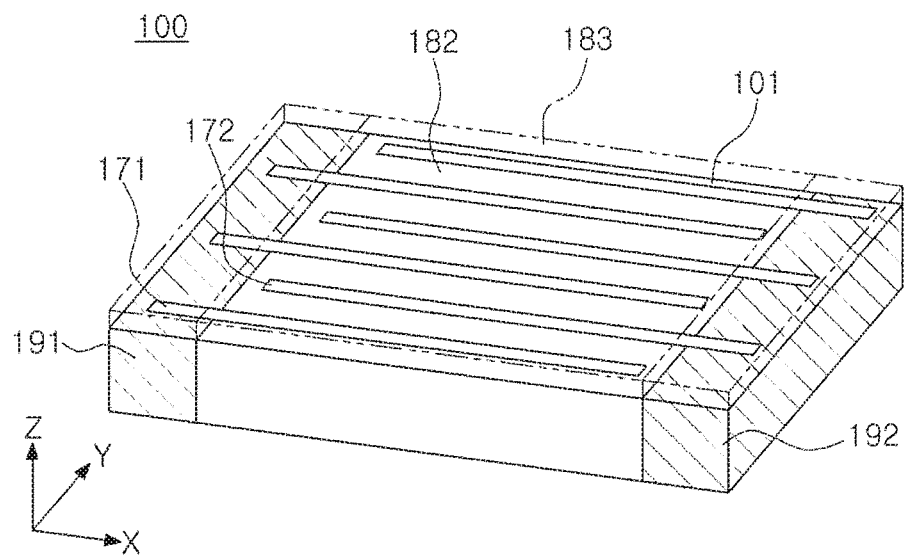
Figure 25:
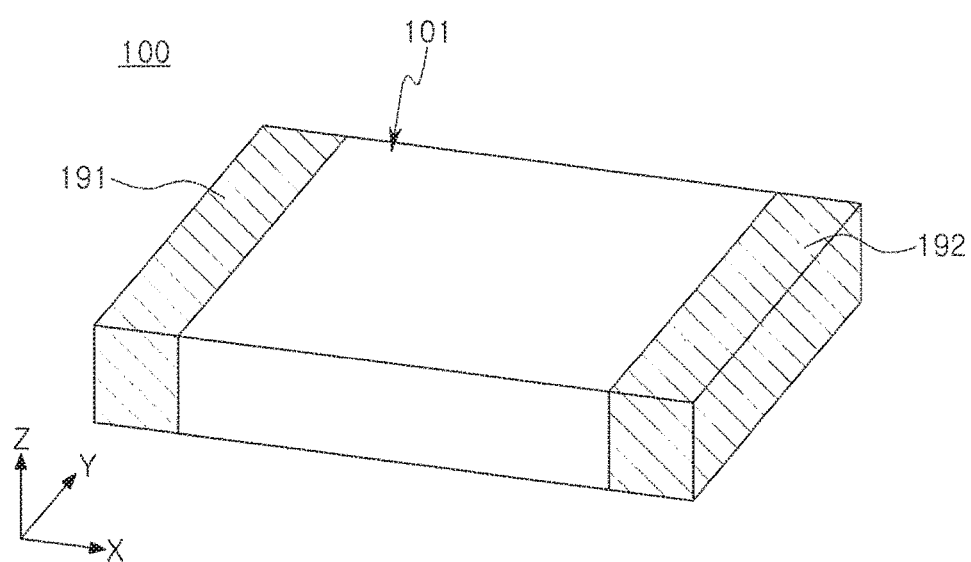

After the capacitance part 120 is formed, a body 101 may be completed forming an insulating layer 182 between the connection electrodes 171 and 172 and forming the cover layer 183 thereon as illustrated in FIG. 24.

First and second external electrodes 191 and 192 may be formed on both end surfaces of the body 101 in the first (X) direction. The first and second external electrodes 191 and 192 may be formed by dipping both end surfaces of the body 101 in the first (X) direction in a paste containing a conductive material. If necessary, the first and second external electrodes 191 and 192 may further include plating layers formed thereon.

When the external electrodes 191 and 192 are formed as described above, a capacitor illustrated in FIG. 25 may be completed.

As set forth above, according to exemplary embodiments in the present disclosure, the capacitor includes the first trench disposed inwardly from one surface of the substrate and the second trench disposed inwardly from one surface of the capacitance layer disposed on the substrate. A total surface area contributing to implementing capacitance of the capacitor may be significantly increased, such that capacitance of the capacitor may be significantly increased.

While exemplary embodiments have been shown and described above, it will be apparent to those skilled in the art that modifications and variations could be made without departing from the scope of the present invention as defined by the appended claims.

What is claimed is:

1. A capacitor comprising:
a body including a substrate and a capacitance layer disposed on the substrate,
wherein the substrate includes:
a plurality of first trenches penetrating from one surface of the substrate to an interior of the substrate; and
a first capacitor layer disposed on the one surface of the substrate and in the first trenches and including a first dielectric layer and first and second electrodes alternately disposed with the first dielectric layer interposed therebetween, the capacitance layer includes:
a plurality of second trenches penetrating from one surface of the capacitance layer to an interior of the capacitance layer; and
a second capacitor layer disposed on the one surface of the capacitance layer and in the second trenches and including a second dielectric layer and third and fourth electrodes alternately disposed with the second dielectric layer interposed therebetween, and
the first trenches are separate from the second trenches and have wider widths or deeper depths as compared to the second trenches.

2. The capacitor of claim 1, wherein the capacitance layer is composed of two or more capacitance layers each including a plurality of second trenches penetrating from one surface of the capacitance layer and a second capacitor layer disposed on the one surface of the capacitance layer and in the second trenches.

3. The capacitor of claim 1, wherein the substrate is formed of silicon, and the capacitance layer is formed of polycrystalline silicon or amorphous silicon.

4. The capacitor of claim 3, wherein n-type impurities are doped on the one surface of the substrate, the one surface of the capacitance layer and surfaces of the first and second trenches.

5. The capacitor of claim 1, further comprising an insulating layer disposed between the substrate and the capacitance layer.

6. The capacitor of claim 1, wherein the first trenches have wider widths as compared to the second trenches.

7. The capacitor of claim 1, wherein a number of the second trenches disposed per unit area is higher than a number of the first trenches disposed per unit area.

8. The capacitor of claim 1, further comprising:
a first connection electrode penetrating from the one surface of the capacitance layer to the first electrode; and
a second connection electrode penetrating from the one surface of the capacitance layer to the second electrode,
wherein the first connection electrode is connected to the first and third electrodes, and the second connection electrode is connected to the second and fourth electrodes.

9. The capacitor of claim 8, further comprising:
first and second external electrodes disposed on respective surfaces of the body opposing each other in a first direction,
wherein the first connection electrode is extended to be elongated in the first direction of the body, such that one end portion of the first connection electrode is connected to the first external electrode, and
the second connection electrode is extended to be elongated in the first direction of the body, such that one end portion of the second connection electrode is connected to the second external electrode.

10. The capacitor of claim 8, further comprising:
a cover layer disposed on the first and second connection electrodes; and first and second external electrodes disposed on the cover layer and connected to the first and second connection electrodes through first and second conductive vias, respectively.

11. A method of manufacturing a capacitor, the method comprising:
forming a plurality of first trenches penetrating from one surface of a substrate to an interior of the substrate by etching the substrate;
forming a first capacitor layer including a first dielectric layer and first and second electrodes alternately disposed with the first dielectric layer interposed therebetween on the one surface of the substrate and in the plurality of first trenches;
forming a capacitance layer on the one surface of the substrate;
forming a plurality of second trenches penetrating from one surface of the capacitance layer to an interior of the capacitance layer by etching the capacitance layer; and
forming a second capacitor layer including a second dielectric layer and third and fourth electrodes alternately disposed with the second dielectric layer interposed therebetween on the one surface of the capacitance layer and in the plurality of second trenches,
wherein the first trenches are separate from the second trenches and are formed to have wider widths or deeper depths as compared to the second trenches.

12. The method of claim 11, wherein the forming of the capacitance layer is performed by depositing polycrystalline silicon or amorphous silicon on the one surface of the substrate.

13. The method of claim 11, further comprising, after the forming of the second capacitor layer, steps for:
forming a second capacitance layer on the one surface of the capacitance layer,
forming of a second trench penetrating from one surface of the second capacitance layer to an interior of the second capacitance layer by etching the second capacitance layer, and
forming of a second capacitor layer including a second dielectric layer and third and fourth electrodes alternately disposed with the second dielectric layer interposed therebetween on the one surface of the second capacitance layer and in the second trench penetrating the second capacitance layer.

14. The method of claim 11, further comprising forming a first connection electrode penetrating from one surface of the second capacitor layer to the first electrode to thereby be connected to the first and third electrodes, and forming a second connection electrode penetrating from the one surface of the second capacitor layer to the second electrode to thereby be connected to the second and fourth electrodes.

15. The method of claim 14, further comprising:
forming a cover layer on the second capacitor layer to form a body; and
forming first and second external electrodes respectively connected to the first and second connection electrodes on an outer portion of the body.

16. The method of claim 11, wherein the first trenches are formed to have a deeper depth as compared to the second trenches.

17. A capacitor comprising:
a first capacitor layer including a first dielectric layer and first and second electrodes disposed on opposing sides of the first dielectric layer,
wherein the first capacitor layer, the first dielectric layer, and the first and second electrodes each include a planar portion extending along a surface of a support member and a U-shaped portion extending into the surface of the support member; and
a second capacitor layer disposed above the surface of the support member, the second capacitor layer including a second dielectric layer and third and fourth electrodes disposed on opposing sides of the second dielectric layer,
wherein the second capacitor layer, the second dielectric layer, and the third and fourth electrodes each include a planar portion extending parallel to the surface of the support member and a U-shaped portion extending from the planar portion, and
wherein the U-shaped portions of the first and second capacitor layers are separate from each other and at least one of a depth and a width of the U-shaped portion of the first capacitor layer is different from a depth and a width, respectively, of the U-shaped portion of the second capacitor layer.

18. The capacitor of claim 17, wherein the U-shaped portion of the second capacitor layer extends from the planar portion of the second capacitor layer in the direction of the first capacitor layer.

19. The capacitor of claim 17, wherein each of the first and second capacitor layers includes a plurality of U-shaped portions extending from the respective planar portions.

20. The capacitor of claim 17, wherein the first capacitor layer includes a plurality of first dielectric layers and first and second electrodes alternately disposed on opposing side of each first dielectric layer of the plurality of first dielectric layers, and
each of the plurality of first dielectric layers extends substantially parallel to each other in the planar portion and the U-shaped portion thereof.

21. The capacitor of claim 17, wherein the second capacitor layer is spaced apart from the first capacitor layer such that the U-shaped portion of the second capacitor layer is disposed wholly on one side of the planar portion of the first capacitor layer.

22. The capacitor of claim 17, further comprising a first connection electrode extending between and interconnecting the planar portion of the first electrode and the planar portion of the third electrode, and a second connection electrode extending between and interconnecting the planar portion of the second electrode and the planar portion of the fourth electrode.

* * * * *